(12) United States Patent
Turnbeaugh et al.

(10) Patent No.: US 11,815,415 B2
(45) Date of Patent: *Nov. 14, 2023

(54) REFERENCE SIGNAL COMPENSATION FOR MAGNETOSTRICTIVE SENSOR

(71) Applicant: Bently Nevada, LLC, Minden, NV (US)

(72) Inventors: Lysle R. Turnbeaugh, Minden, NV (US); Daniel Lewis Farr, Minden, NV (US)

(73) Assignee: Bently Nevada, LLC, Minden, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/583,610

(22) Filed: Jan. 25, 2022

(65) Prior Publication Data
US 2022/0146345 A1 May 12, 2022

Related U.S. Application Data

(63) Continuation of application No. 16/513,686, filed on Jul. 16, 2019, now Pat. No. 11,287,337.

(51) Int. Cl.
| | |
|---|---|
| *G01L 3/00* | (2006.01) |
| *G01L 3/10* | (2006.01) |
| *G01B 7/14* | (2006.01) |
| *G01V 3/10* | (2006.01) |
| *H10N 35/00* | (2023.01) |
| *G01L 1/12* | (2006.01) |

(52) U.S. Cl.
CPC ............... *G01L 3/102* (2013.01); *G01B 7/14* (2013.01); *G01V 3/104* (2013.01); *H10N 35/101* (2023.02); *G01L 1/125* (2013.01)

(58) Field of Classification Search
CPC ....... G01L 3/102; G01L 1/125; H10N 35/101; G01B 7/14; G01V 3/104
See application file for complete search history.

(56) References Cited

U.S. PATENT DOCUMENTS 5,495,774 A * 3/1996 Klauber .................. G01L 3/102
73/114.11
6,144,206 A * 11/2000 Goldfine ................ G01V 3/088
324/345

(Continued)

*Primary Examiner* — Max H Noori
(74) *Attorney, Agent, or Firm* — MINTZ LEVIN COHN FERRIS GLOVSKY AND POPEO, PC

(57) ABSTRACT

A gap compensated stress sensing system and methods for using the same are provided. The system can include a sensor head in communication with a controller. The sensor head can contain a stress sensor configured to generate a stress signal representing stress applied to a target based upon measurement of generated magnetic fluxes passing through the target. The system can also include a drive circuit configured to provide a current for generation of the magnetic fluxes, and to measure signals characterizing a gap between the sensor head and the target. The controller can analyze these signals to determine a gap-dependent reference signal that is relatively insensitive to electrical runout. The controller can further adjust the stress signal based upon the gap-dependent reference signal to determine an improved stress signal that has reduced sensitivity to gap changes.

16 Claims, 8 Drawing Sheets

(56) References Cited

U.S. PATENT DOCUMENTS

| | | | |
|---|---|---|---|
| 2004/0050179 A1* | 3/2004 | Kilmartin | G01L 3/102 |
| | | | 73/862.331 |
| 2014/0035564 A1* | 2/2014 | Lee | G01B 7/14 |
| | | | 324/207.12 |
| 2014/0182388 A1* | 7/2014 | Sipila | G01L 1/127 |
| | | | 73/779 |
| 2018/0335353 A1* | 11/2018 | Lu | G01L 3/102 |
| 2019/0072449 A1* | 3/2019 | Folkner | G01L 1/125 |
| 2021/0018386 A1* | 1/2021 | Turnbeaugh | G01V 3/104 |

* cited by examiner

REFERENCE SIGNAL COMPENSATION FOR MAGNETOSTRICTIVE SENSOR

CROSS REFERENCE TO RELATED APPLICATIONS

This application is a continuation of U.S. patent application Ser. No. 16/513,686, filed Jul. 16, 2019 and entitled "REFERENCE SIGNAL COMPENSATION FOR MAGNETOSTRICTIVE SENSOR," the entire contents of which are hereby incorporated by reference herein in its entirety.

BACKGROUND

Sensors can be used in a variety of industries to monitor equipment. As an example, stress sensors can be used to monitor rotating machine components (e.g., shafts) and output signals representative of stress applied to the monitored components. By comparing measured stresses to design specifications, it can be determined whether monitored components are operating within these specifications.

SUMMARY

Magnetostrictive sensors are a type of sensor that employs magnetic fields for measuring mechanical stresses, such as torque. As an example, a magnetostrictive sensor can generate a magnetic flux that permeates a rotating shaft and it can measure the magnetic flux as it interacts with the rotating shaft. The intensity of the measured magnetic flux can vary due to changes in stress experienced by the rotating shaft. Thus, magnetostrictive sensors can output stress signals representative of stress applied to a rotating shaft based upon magnetic flux measurements. In certain embodiments, torque can be calculated from stress and the geometry of the shaft.

While the magnetic flux measured by a magnetostrictive sensor can depend upon the stress applied to the rotating shaft, it can also depend upon a distance or gap separating the magnetostrictive sensor from the surface of the rotating shaft. As a result, stress signals acquired by a magnetostrictive sensor can also vary due to changes in this physical gap (e.g., due to vibrations), independently of the stress applied to the rotating shaft. For example, a non-ideal environment may result in vibrations of the rotating shaft and attendant changes in the gap. If gap-related changes in measured stress signals are not accounted for, the sensitivity and accuracy of stress measurements output by the magnetostrictive sensor can be reduced.

For this reason, it can be desirable to reduce the sensitivity of stress measurements acquired by the magnetostrictive sensor to the gap, referred to herein as gap compensation. As an example, a gap-dependent stress signal acquired by a magnetostrictive sensor can be combined with another gap-dependent signal to yield a gap-compensated stress signal. The gap-dependent stress signal and the gap-dependent signal can be combined in a suitable manner such that the gap-compensated stress signal possesses significantly reduced sensitivity to gap, as compared to the gap-dependent stress signal.

As an example, the gap-dependent signal can be acquired using a proximity sensor, such as an eddy current proximity probe. However, the magnetic properties of the target can vary about its circumference. Under this circumstance, the gap-dependent signal measured by a proximity sensor can change during rotation of the target, independently of change in the gap, referred to as electrical runout. Electrical runout can lead to introduction of error in the gap-dependent signal that repeats every revolution of the target. Thus, use of a gap-dependent signal containing error due to electrical runout for gap compensation can propagate this error to the gap-compensated stress signal. Accordingly, there is a need for systems and corresponding methods that provide relatively clean, gap-dependent signals exhibiting reduced sensitivity to electrical runout for use in gap compensation.

In one embodiment, a system is provided that includes a magnetostrictive sensor, a drive circuit, and a controller. The magnetostrictive sensor can include a drive coil configured to generate a magnetic flux in response to receipt of a current. The drive circuit can be in communication with the drive coil and configured to provide the current. The drive circuit can include a first sensing element and a second sensing element. The first sensing element can be in parallel with the drive coil and it can be configured to measure a first electrical property proportional to a voltage applied across the drive coil as a function of time while the generated magnetic flux interacts with at least a portion of a target. The first sensing element can also be configured to generate a first signal based upon the first electrical property measurement. The second sensing element can be configured to measure a second electrical property proportional to a current flowing through the drive coil as a function of time while the generated magnetic flux interacts with at least a portion of the target. The second sensing element can also be configured to generate a second signal based upon the second electrical property measurement. The controller can be in electrical communication with the magnetostrictive sensor. The controller can also be configured to receive the first and second signals and to determine a gap compensation signal based upon a function of the first signal and the second signal.

In another embodiment, the magnitude of the first signal and the magnitude of the second signal can change in the same direction in response to variation of a gap between the drive coil and the target.

In another embodiment the magnitude of the first signal and the magnitude of the second signal can change in opposite directions in response to circumferential variation of magnetic properties of the rotating target.

In another embodiment, the controller can be further configured to apply a predetermined gain to at least one of the first and second signals, prior to determining the gap compensation signal, and to determine the gap compensation signal based upon the sum of the first signal and the second signal after application of the predetermined gain.

In another embodiment, the predetermined gain can be selected such that, after application, the magnitude of respective portions of the first signal and modified second signals representing response of the measured first and second electrical properties to circumferential variation of magnetic properties of the rotating target are approximately equal to the magnitude.

In another embodiment, the magnetostrictive sensor can further include a sensing coil configured to output a stress signal characterizing a stress experienced by the rotating target. The stress signal can be based at least upon a measurement of the generated magnetic flux resulting from interaction of the first magnetic flux with the target.

In another embodiment, the controller can be further configured to receive the stress signal, to combine the stress signal with the gap compensation signal to yield a gap compensated stress signal, and to output the gap compensated stress signal.

In another embodiment, the stress can be a torque.

In another embodiment, the magnetostrictive sensor can include a sensor head including a driving pole and a sensing pole. The drive coil can be coupled to the driving pole and the sensing coil can be coupled to the sensing pole.

Methods for determining a gap-dependent signal exhibiting reduced sensitivity to electrical runout for use in gap compensation are provided. In one embodiment, the method can include generating, by a drive coil of a sensor, a magnetic flux in response to receipt of a current. The method can also include measuring, by a drive circuit, a first electrical property proportional to a voltage applied across the drive coil as a function of time while the generated magnetic flux interacts with at least a portion of a target. The method can further include measuring, by the drive circuit, a second electrical property proportional to a current flowing through the drive coil as a function of time while the generated magnetic flux interacts with at least the portion of the target. The method can additionally include receiving, by a controller, a first signal based upon the measured first electrical property and a second signal based upon the second measured electrical property. The method can also include determining, by the controller, a gap compensation signal based upon a function of the first signal and the second signal.

In another embodiment, the magnitude of the first signal and the magnitude of the second signal can change in the same direction in response to variation of a gap between the drive coil and the target.

In another embodiment, the magnitude of the first signal and the magnitude of the second signal can change in opposite directions in response to circumferential variation of magnetic properties of the rotating target.

In another embodiment, the method can further include applying a predetermined gain to at least one of the first and second signals prior to determining the gap compensation signal, and determining the gap compensation signal based upon the sum of the first signal and the second signal after application of the predetermined gain. The predetermined gain can be selected such that, after application, the magnitude of the respective portions of the first signal and the second signal, representing response of the measured first and second electrical properties to circumferential variation of magnetic properties of the rotating target, are approximately equal in magnitude.

In another embodiment, the sensor can be a magnetostrictive sensor including a sensing coil configured to output a stress signal characterizing a stress experienced by the rotating target. The stress signal can be based at least upon a measurement of the generated magnetic flux resulting from interaction of the first magnetic flux with a target.

In another embodiment, the method can also include, by the controller, receiving the stress signal, combining the stress signal with the gap compensation signal to yield a gap-compensated stress signal, and outputting the gap-compensated stress signal.

In another embodiment, the stress can be a torque.

In another embodiment, the magnetostrictive sensor can also include a sensor head including a driving pole and a sensing pole. The drive coil can be coupled to the driving pole and the sensing coil can be coupled to the sensing pole.

DESCRIPTION OF DRAWINGS

These and other features will be more readily understood from the following detailed description taken in conjunction with the accompanying drawings, in which.

It is noted that the drawings are not necessarily to scale. The drawings are intended to depict only typical aspects of the subject matter disclosed herein, and therefore should not be considered as limiting the scope of the disclosure.

DETAILED DESCRIPTION

Magnetostrictive sensors are a type of sensor that can use magnetic signals to measure stress (e.g., torque) applied to a shaft. However, a magnetostrictive stress sensor can be highly sensitive to changes in the gap distance between itself and the shaft. If the gap distance changes while it makes stress measurements, which can occur due to vibrations, the change in gap distance can introduce error into the stress measurements. To reduce such error and improve the quality of the stress measurements, some existing sensors can measure changes in the gap distance to adjust the torque measurements. Due to variations in the magnetic properties of the shaft, it can be difficult to measure the gap distance accurately. Accordingly, improved techniques for determining gap changes are provided for use with magnetostrictive stress sensors to enhance the accuracy of stress and/or torque measurements, by compensating for gap changes as well as variation in magnetic properties of the shaft.

Embodiments of sensing systems and corresponding methods for gap-compensation of stress measurements acquired for rotating machine components are discussed herein. In certain embodiments, torque measurements can be obtained from the stress measurements and the geometry of the target (e.g., a shaft). However, embodiments of the disclosure can be employed to perform gap-compensation of any stress applied to rotating or stationary machine components without limit.

Figure 1:
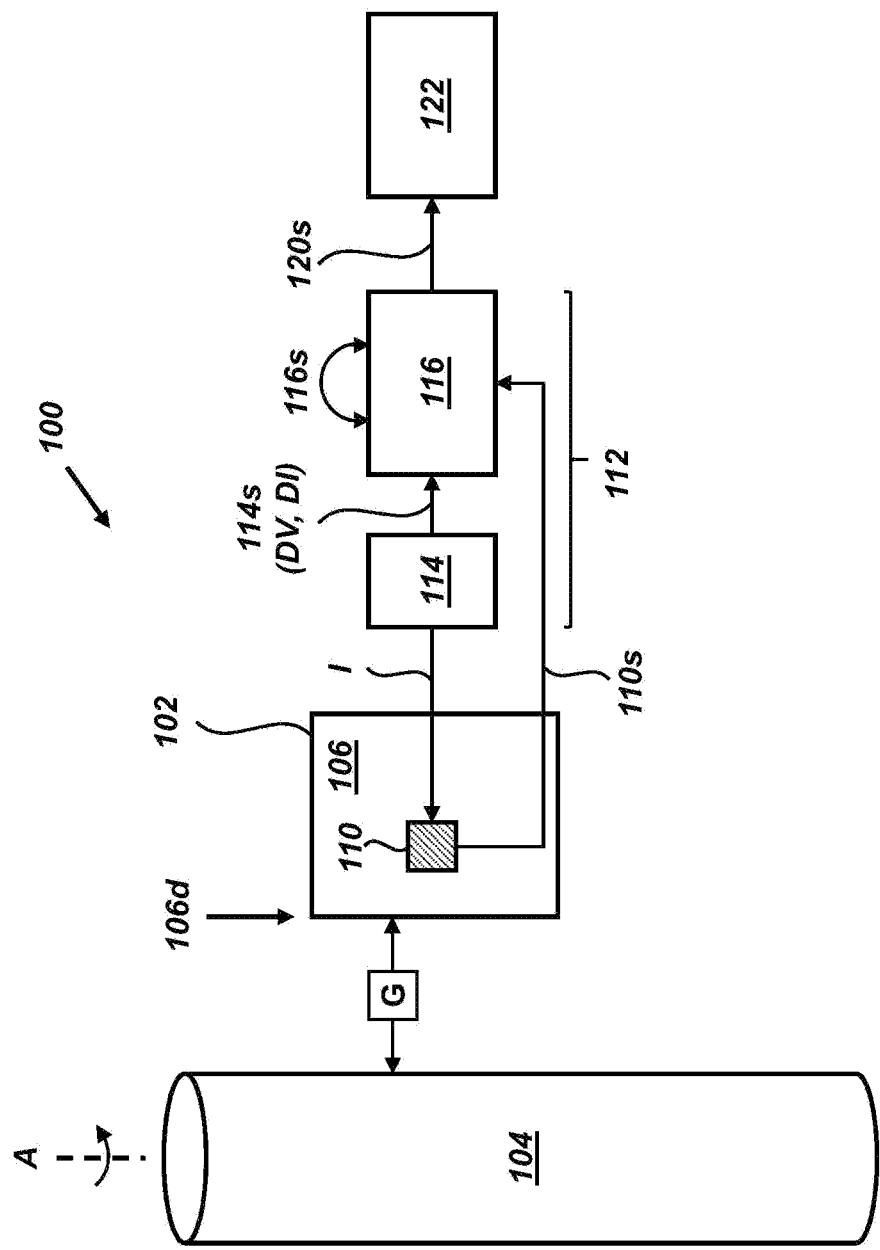
FIG. 1 is a diagram illustrating one exemplary embodiment of an operating environment including a gap-compensated stress sensing system having a magnetostrictive stress sensor configured to determine a gap-dependent reference signal.

FIG. 1 illustrates one exemplary embodiment of an operating environment 100 containing a gap-compensated stress sensing system 102, referred to herein as compensated stress sensing system 102, and a target 104. The compensated stress sensing system 102 can be a magnetostrictive stress sensing system including a sensor head 106, a stress sensor 110, and a controller 112 including a drive circuit 114 and one or more processors 116. The stress sensor 110 can be positioned within the sensor head 106 and it can be configured to generate one or more stress signals 110s representative of stress applied to a selected portion of the target 104 as a function of time. The drive circuit 114 can be configured to supply a current I to the stress sensor 110 for generation of the stress signal 110s.

As discussed in greater detail below, the drive circuit 114 can be further configured to generate and output a plurality of signals 114s based upon measurement of electrical properties of the drive circuit 114. The plurality of signals 114s can include a first signal based upon measurement of a first electrical property, proportional to a voltage applied across a driving coil of the stress sensor 110, as a function of time. The first signal is also referred to herein as drive voltage DV. The plurality of signals 114s can also include a second signal based upon measurement of a second electrical property, proportional to the current I flowing through the driving coil of the stress sensor 110, as a function of time. The second signal is also referred to herein as drive current DI.

It has been discovered that the magnitude of the drive voltage DV and the magnitude of the drive current DI do not respond in the same way to each of (a) variation in a gap G between the sensor head (e.g., a distal end 106*d*) and a surface of the target 104, and (b) electrical runout. Instead, the magnitude of the drive voltage DV and the magnitude of the drive current DI change in the same direction (e.g., both increasing or both decreasing) in response to one of variation of the gap G and electrical runout. Furthermore, the magnitude of the drive voltage DV and the magnitude of the drive current DI change in opposite directions (e.g., one increasing and one decreasing) in response to the other of variation of the gap G and electrical runout. In either case, a function based upon the drive voltage DV and the drive current DI can be employed (e.g., by the processor 116) to determine a gap-dependent reference signal 116s exhibits enhanced sensitivity to the gap G and reduced sensitivity to electrical runout. As discussed in detail below, in one embodiment, the function can be addition of the drive voltage DV and the drive current DI, or mathematical equivalents thereof. In another embodiment, the function can be subtraction of the drive voltage DV and the drive current DI or mathematical equivalents thereof. In general, the function is not limited to addition or subtraction. The function can include mathematical operations such as addition, subtraction, division, multiplication, logarithms, exponentiation, or trigonometric functions, alone or in any combination.

In one example, the magnitude of the drive voltage DV and the magnitude of the drive current DI can respond together with variation in the gap G, and can respond opposite to electrical runout. That is, the magnitude of each increases or decreases together in response to variation in the gap G, while one increases and the other decreases in response to electrical runout. In this scenario, the drive voltage DV and the drive current DI can be summed to obtain the gap-dependent reference signal 116s.

In another example, the magnitude of the drive voltage DV and the magnitude of the drive current DI can respond in opposite directions with variation in the gap G, and can respond in the same direction to electrical runout. That is, the magnitude of one increases and one decreases in response to variation in the gap G, while the magnitude of each increases or decreases together in response to electrical runout. In this scenario, the drive voltage DV and the drive current DI can be subtracted from one another to obtain the gap-dependent reference signal 116s.

In use, the sensor head 106 can be positioned proximate to the target 104 for acquiring stress measurements. The processor 116 can receive the measured stress signals 110s and the measured signals 114s. The gap-dependent reference signal 116s can be determined using the function of the measured signals 114s. The processor 116 can be further configured to employ the stress signals 110s and the gap-dependent reference signal 116s to determine an improved gap-compensated stress signal 120s, also referred to herein as a compensated stress measurement. The improved gap compensated stress signal 120s can represent a measurement of stress applied to the target 104 as a function of time which has reduced sensitivity to changes in the gap G, as compared to the stress signal 110s.

The compensated stress signal 120s can be subsequently output by the processor 116. As an example, the compensated stress signal 120s can be received by one or more external devices 122, such as a display for presentation to a user and/or a data storage device for storage and subsequent retrieval.

Figure 2:
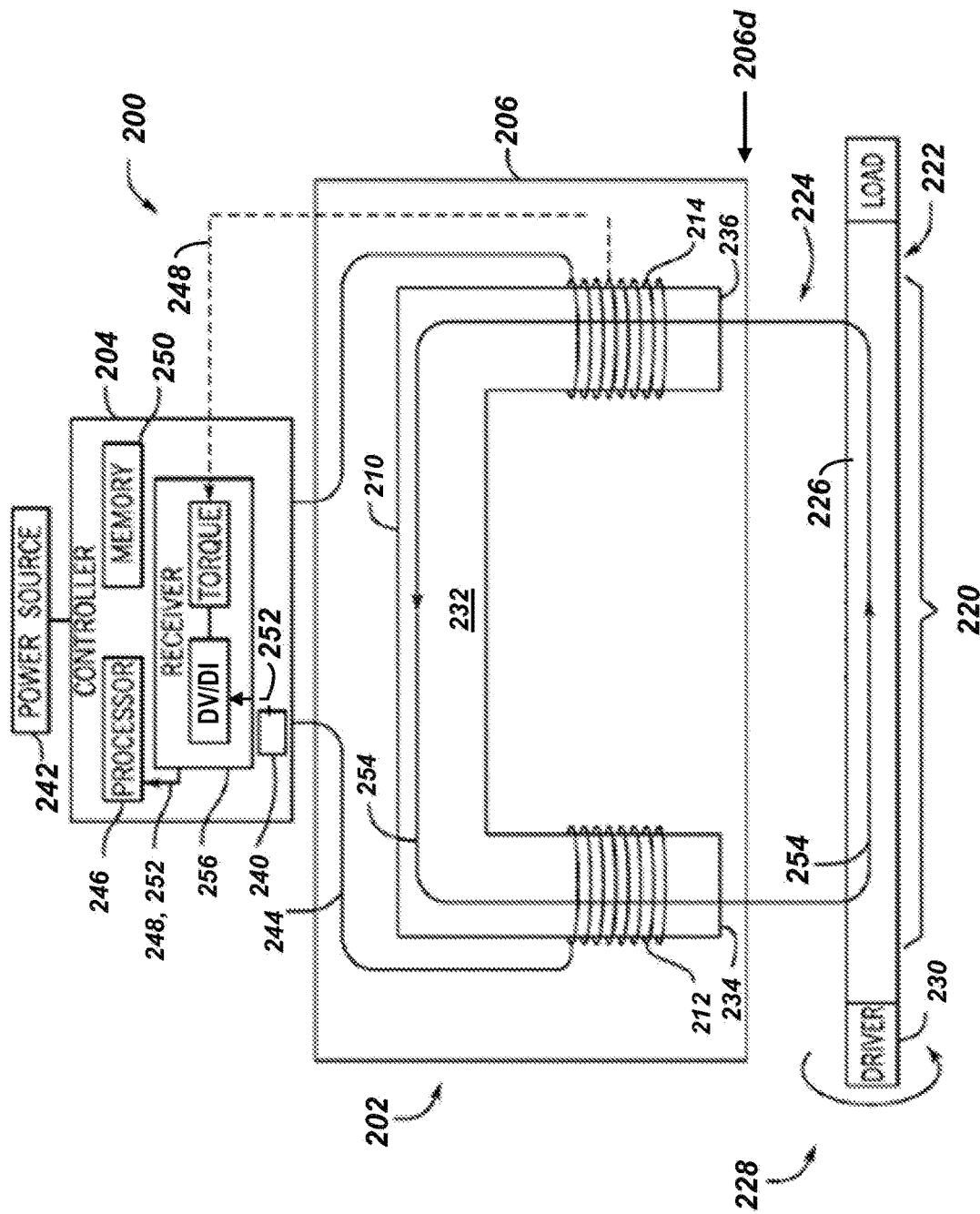
FIG. 2 is a side cross-sectional view of the gap-compensated magnetostrictive stress sensing system according to FIG. 1, illustrating a sensor head including a magnetostrictive stress sensor in electrical communication with a drive circuit of a controller.

FIG. 2 is a side cross-sectional view of one exemplary embodiment of the compensated stress sensing system 100 in the form of compensated stress sensing system 200. The compensated stress sensing system 200 includes a sensor head 202 in electrical communication with a controller 204. The sensor head 202 can form a housing 206 that contains a magnetostrictive stress sensor including a core 210, a drive coil 212, and at least one sensing coil 214. As discussed in greater detail below, the magnetostrictive stress sensor can be configured to output stress signals characterizing stress applied to a selected portion 220 of a target 222 (e.g., a portion of the target 222 positioned opposite the sensor head 202). The controller 204 can be further configured to determine a gap-dependent reference signal that characterizes a gap 224 between the sensor head 202 (e.g., a distal end 206*d* of the housing 206) and the selected portion 220 of the target 222 concurrently with the stress measurements acquired by the stress sensor. The gap-dependent reference signal can exhibit significantly reduced sensitivity to electrical runout of the target 222, as compared with other techniques for acquiring gap-dependent measurements (e.g., eddy current proximity sensors).

The target 222 can be a component of any machine or equipment 228 that is configured to rotate. Examples of rotating components can include, but are not limited to, shafts and rotors. Examples of machines and equipment 228 incorporating rotating components can include, but are not limited to, turbomachines (e.g., turbine engines, compressors, pumps, and combinations thereof), generators, combustion engines, and combinations thereof. Stress can be applied to the target 222 by a driver 230 (e.g., a reciprocating engine, a combustion engine, a turbine engine, an electrical motor, etc.) to enable the target 222 to rotate and drive a load. The target 222 can be formed from materials including, but not limited to, ferromagnetic materials such as iron, steel, nickel, cobalt, and alloys thereof. In certain embodiments, the target 222 can be non-magnetized. In other embodiments, the target 222 can be magnetized.

The core 210 can include a base 232 and at least two elongated poles 234, 236. The poles 234, 236 can extend outwards from the base 232 and they can be separated from one another by a selected distance. The core 210 can be formed from any ferromagnetic material. Examples can include, but are not limited to, iron, steel, nickel, cobalt, and alloys thereof. One of the poles 234 can be a driving pole to which the drive coil 212 is wrapped around. The other of the poles 236 can be a sensing pole to which the sensing coil 214 is wrapped around.

The drive coil 212 and the sensing coil 214 can each be in electrical communication with the controller 204. As shown in FIG. 2, the controller 204 can be electrically coupled to a drive circuit 240 by wired or wireless connections. Wireless communication devices, such as radio frequency (RF) transmitters, can be integrated with the controller 204 to transmit the signals to an RF receiver integrated with the drive circuit 240. As also shown in FIG. 2, the controller 204 can be positioned remotely from the sensor head 202. However, in alternative embodiments (not shown), the controller 204 can be positioned within the sensor head 202.

A power source 242 (e.g., electrical outlets, electrical generators, batteries, etc.) can provide power to the controller 204 and a drive circuit 240. The drive circuit 240 can be configured to deliver a current 244 (e.g., an AC current) to the drive coil 212. The controller 204 can be configured to control characteristics (e.g., frequency, amplitude, etc.) of the current 244. The controller 204 can be any computing device employing a general purpose or application-specific processor 246. In either case, the controller 204 can include memory 250 for storing instructions related to characteristics of the current 244, such as frequency, amplitude, and combinations thereof. The memory 250 can also include instructions and algorithms for employing sensor signals (e.g., stress signal 248 and a gap-dependent reference signal) to determine gap-compensated stress measurements, as discussed in greater detail below.

The processor 246 can include one or more processing devices, and the memory 250 can include one or more tangible, non-transitory, machine-readable media collectively storing instructions executable by the processor 246 to perform the methods and control actions described herein. Embodiments of the controller 204 can be implemented using analog electronic circuitry, digital electronic circuitry, and/or combinations thereof.

The current 244 can pass through the drive coil 212 to generate a magnetic flux 254. The magnetic flux 254 can permeate the target 222, pass through the sensing coil 214, and return to the drive coil 212 via the core 210 (e.g., the base 232 and the sensing pole 236). In this manner, a magnetic loop can be formed through the stress sensor and the target 222.

The sensing coil 214 can be used to measure the magnetic flux 254 exiting the target 222. In general, stress (e.g., compression, tension, torque, shear, etc.) applied to the target 222 can change the magnetic permeability of the target 222, which in turn can cause the magnetic flux 254 measured by the sensing coil 214 to change. Thus, a stress, such as torque, applied to the target 222 can be determined based on the change in magnetic flux 254 received by the sensing coil 214 relative to the magnetic flux 254 generated by the drive coil 212. The sensing coil 214 can be configured to transmit the stress signal 248 to the controller 204 that is indicative of the changes (e.g., difference) in the magnetic flux 254.

The stress signal 248 can be communicated by wired or wireless connections to the controller 204 (e.g., receiver 256). As an example, wireless communication devices, such as RF transmitters, can be integrated with the sensor head 202 (e.g., proximate to the sensing coil 214) to transmit the signals to a receiver 256 (e.g., an RF receiver) integrated with the controller 204. The receiver 256 can optionally include electronic components (e.g., amplifiers, filters, etc.) that are configured to condition the stress signal 248 before transmission to the processor 246.

As discussed above, the magnetic flux 254 measured by the sensing coil 214 can be affected by the gap 224, which can extend between the distal end 206d of the housing 206 and a surface 226 of the target 222, as well as electrical runout of the target 222 during rotation. Thus, stress measurements determined for the target 222 based upon the magnetic flux 254 sensed by the sensing coil 214 can deviate from the actual stress applied to the target 222.

To address this issue, a plurality of electrical properties of the drive circuit 240 can be measured and corresponding signals can be output to the controller 204 as signals 252. As discussed above, a first electrical property of the drive circuit 240, proportional to the voltage applied across the drive coil 212, can be measured as a function of time. A first signal based upon this first electrical property measurement, referred to herein as drive voltage DV, can be output to the controller 204. A second electrical property of the drive circuit 240, proportional to current flowing through the drive coil 212 can also be measured as a function of time. A second signal based upon this second electrical property measurement, referred to herein as drive current DI.

Embodiments of the first and second electrical properties can adopt a variety of configurations. As an example, the first and second electrical properties can be selected independently from any electrical property (e.g., voltage, current, resistance, inductance, capacitance, etc.) In one exemplary embodiment, the first and second electrical properties are each voltages.

The plurality of signals 252 can be communicated by wired or wireless connections to the controller 204 (e.g., receiver 256). The receiver 256 can optionally include electronic components (e.g., amplifiers, filters, etc.) that are configured to condition the plurality of signals 252 before transmission to the processor 246.

The memory 250 can include instructions and algorithms executable by the processor 246 to determine the gap-dependent reference signal, which is relatively insensitive to electrical runout, based upon the plurality of signals 252. The memory 250 can also include instructions and algorithms executable by the processor 246 to determine, using the stress signals 248 and the gap-dependent reference signal, a gap-compensated stress measurement. In this manner, the accuracy of stress measurements output by the compensated stress sensing system 200 can be increased, enabling better control of the machine or equipment 228 incorporating the target 222.

Figure 3:
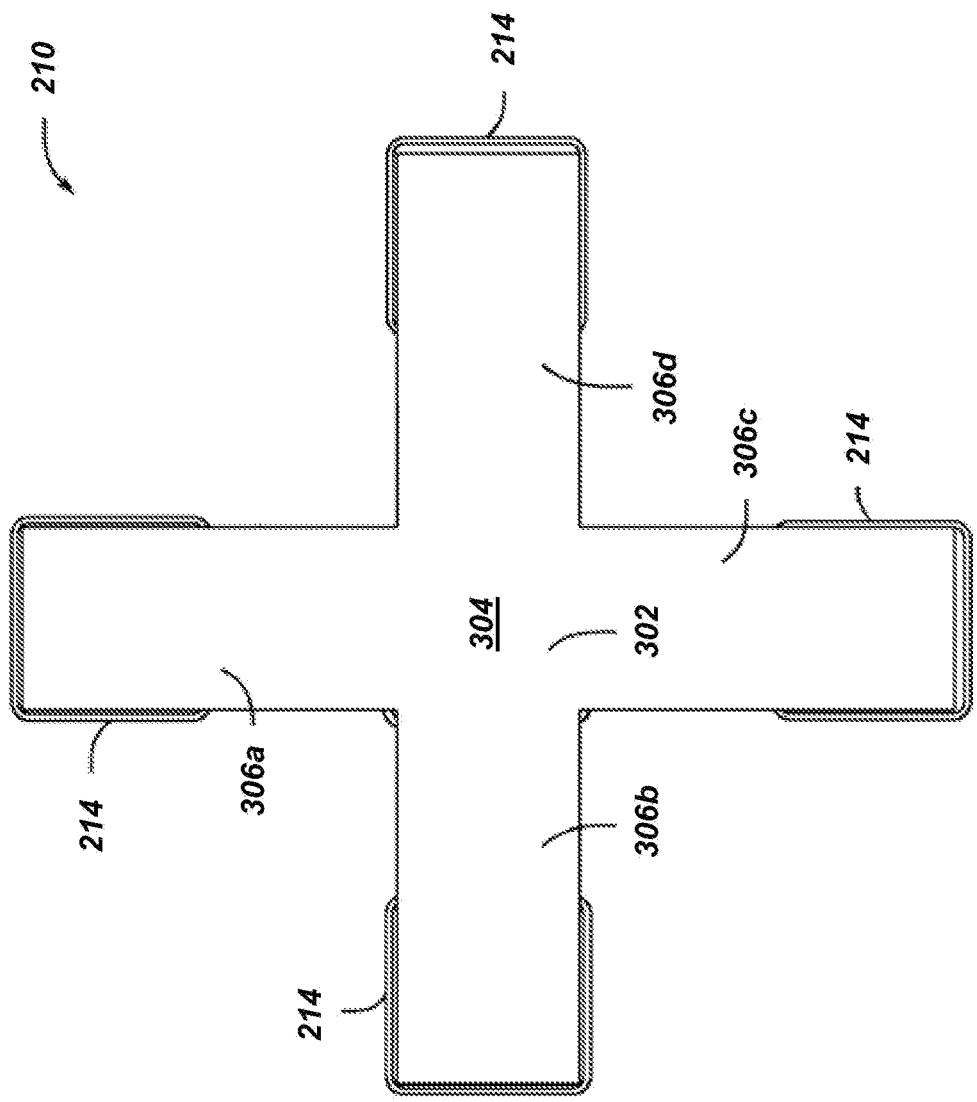
FIG. 3 is a top view of an exemplary embodiment of a core of the magnetostrictive stress sensor of FIG. 2.

FIG. 3 is a top view of an exemplary embodiment of a core 210 of the sensor head 202 of the magnetostrictive stress sensor of FIG. 2. As shown, the core 210 can include a cross axis yoke 302 having a cross yoke portion 304 and four bases 306a, 306b, 306c, 306d. The bases 306a, 306b, 306c, 306d can extend radially outward in a plane from the cross yoke portion 304 in any configuration and for any length that enables each to operate as described herein. The bases 306a, 306b, 306c, 306d can be angularly spaced apart by an angle ranging from about 10 degrees to 135 degrees (e.g., 10 degrees, 20 degrees, 30 degrees, 40 degrees, 45 degrees, 60 degrees, 75 degrees, 90 degrees, 120 degrees, 135 degrees, or any combination thereof). As shown in FIG. 3, the bases 306a, 306b, 306c, 306d can be angularly spaced apart by approximately 90 degrees. Additional embodiments of the sensor head 202 are discussed in U.S. Pat. No. 9,618,408, the entirety of which is hereby incorporated by reference.

Figure 4:
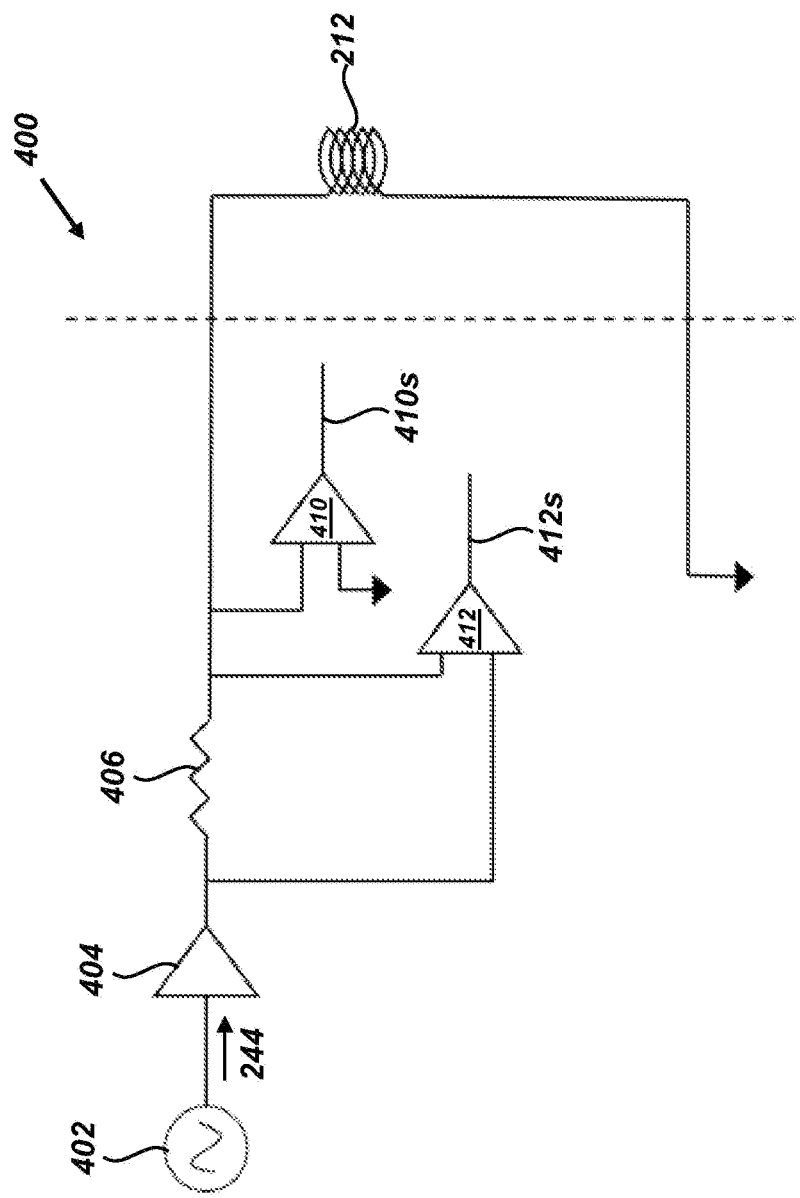
FIG. 4 is a circuit diagram illustrating one exemplary embodiment of the drive circuit in electrical communication with the driving coil of the magnetostrictive stress sensor.

FIG. 4 is a circuit diagram illustrating one exemplary embodiment of the drive circuit 240, in the form of drive circuit 400, in electrical communication with the drive coil 212. As shown, the drive circuit 400 includes an excitation source 402, a driver 404, a sense resistance 406, a first electrical property sensor 410, and a second electrical property sensor 412. The driver 404 and the sense resistance 406 can be in series with the excitation source 402 and the drive coil 212. The first electrical property sensor 410 can be in parallel with the drive coil 212 and the second electrical property sensor 412 can be in parallel with the sensing resistor 406.

In use, the power source 242 can be configured to provide electrical power to the excitation source 402, and the excitation source 402 can be configured to generate current 244 (e.g., AC current) in response. Upon receipt of the current 244, the drive coil 212 can generate the magnetic flux 254.

Use of the sense resistance 406 within the drive circuit 400 can facilitate independent measurements of the voltage across the drive coil 212 and the current through the drive coil 212. In one aspect, the first electrical property sensor 410 can be configured to output a first signal 410s, the drive voltage DV, that is based upon the first electrical property measurement. As noted above, the drive voltage DV can be proportional to voltage applied across the drive coil 406 as a function of time while the generated magnetic flux 254 interacts with at least a portion of the target 222 (e.g., the selected portion 220). The second electrical property sensor 412 can be configured to output a second signal 412s, the drive current DI, that is based upon the second electrical property. As also discussed above, the drive current can be proportional to the current 244 flowing through the drive coil 212.

In one embodiment, the first and second electrical properties can each be voltages. As an example, a first voltage can be measured by the first electrical property sensor across the drive coil 212 and a second voltage can be measured across the sense resistor 406 by the second electrical property sensor.

Figure 5:
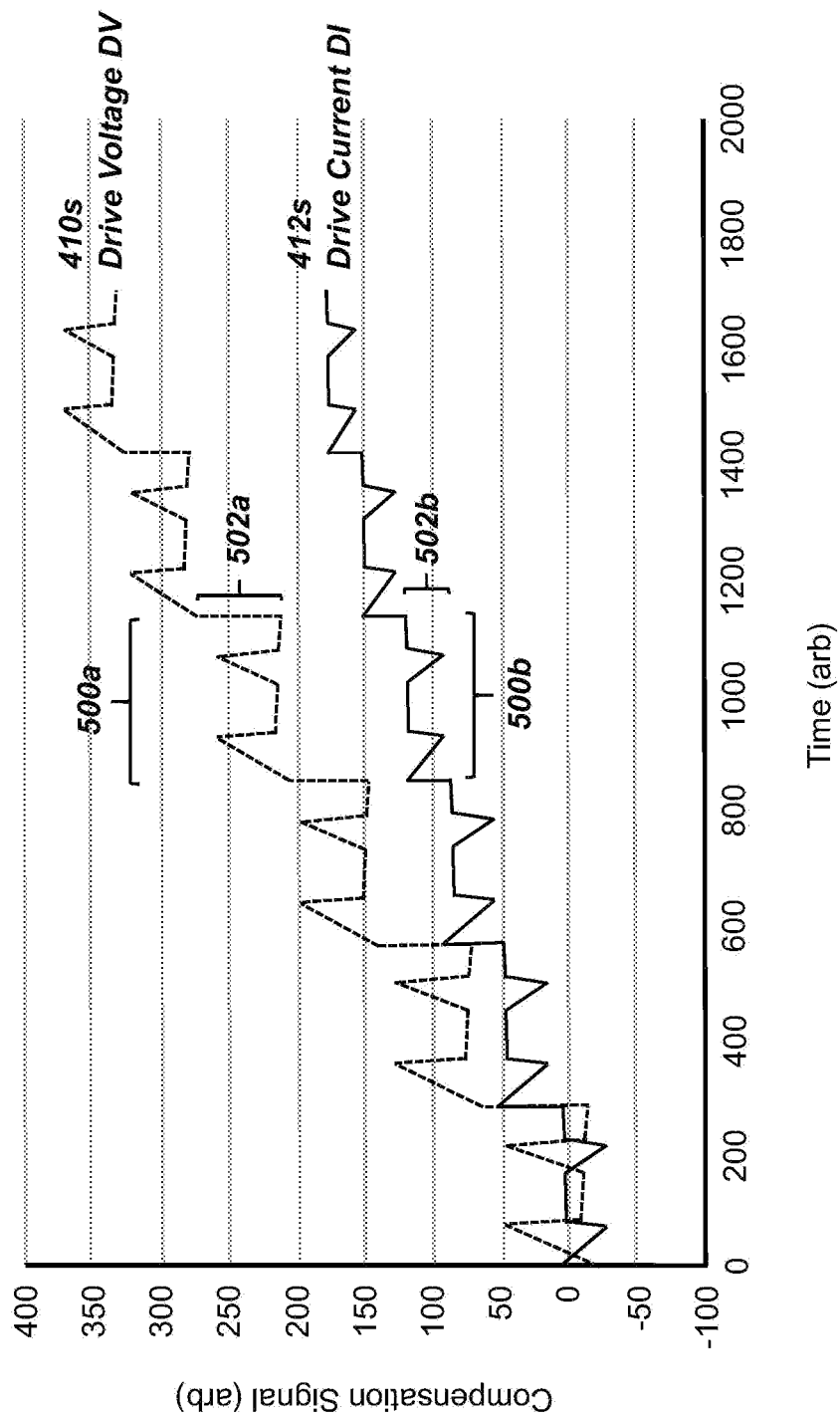
FIG. 5 is a plot of the first and second signals as a function of time with varying gap.

FIG. 5 is a plot of illustrating one embodiment of the first and second signals 410s, 412s output by the first and second sensing elements 410, 412 (drive voltage DV and drive current DI, respectively) and received by the controller 204 (e.g., receiver 256, processor 246) for the first embodiment of the drive current DV and the drive voltage DI. The data are representative of the target 222 during rotation, with the amplitude of the first and second signals 410s, 412s plotted on the vertical axis and time plotted on the horizontal axis, each in arbitrary units (arb). In certain embodiments, regardless of the form of the first and second electrical properties, the first and second signals 410s, 412s can be provided to the controller 204 as a common electrical property (e.g., voltage, current, etc.), or converted by the controller 204, for determining the gap-compensated reference signal.

As shown, the amplitude of the drive voltage DV and the drive current DI each demonstrate a repeated runout pattern 500a, 500b due to electrical runout of the target 222 (e.g., circumferential variation in the magnetic properties of the target 222). Also shown are discrete vertical steps 502a, 502b, representing suspension of data collection while the gap is changed. As discussed above in regards to a first embodiment of the drive voltage DV and the drive current DI, the magnitude of the drive voltage DV and the magnitude of the drive current DI each change in the same direction (e.g., increasing) in response to the same variation in the gap 224. Furthermore, the magnitude of the drive voltage DV and the magnitude of the drive current DI change in opposite directions in response to electrical runout.

In certain embodiments, a predetermined gain (e.g., a constant multiplier) can be applied to at least one of the signals 410s, 412s. The predetermined gain can be selected such that the magnitude of respective portions of the first and second signals 410s, 412s representing response of the measured first and second electrical properties (e.g., runout patterns 500a, 500b) are approximately equal in magnitude (e.g., within ±10% of one another).

Figure 6:
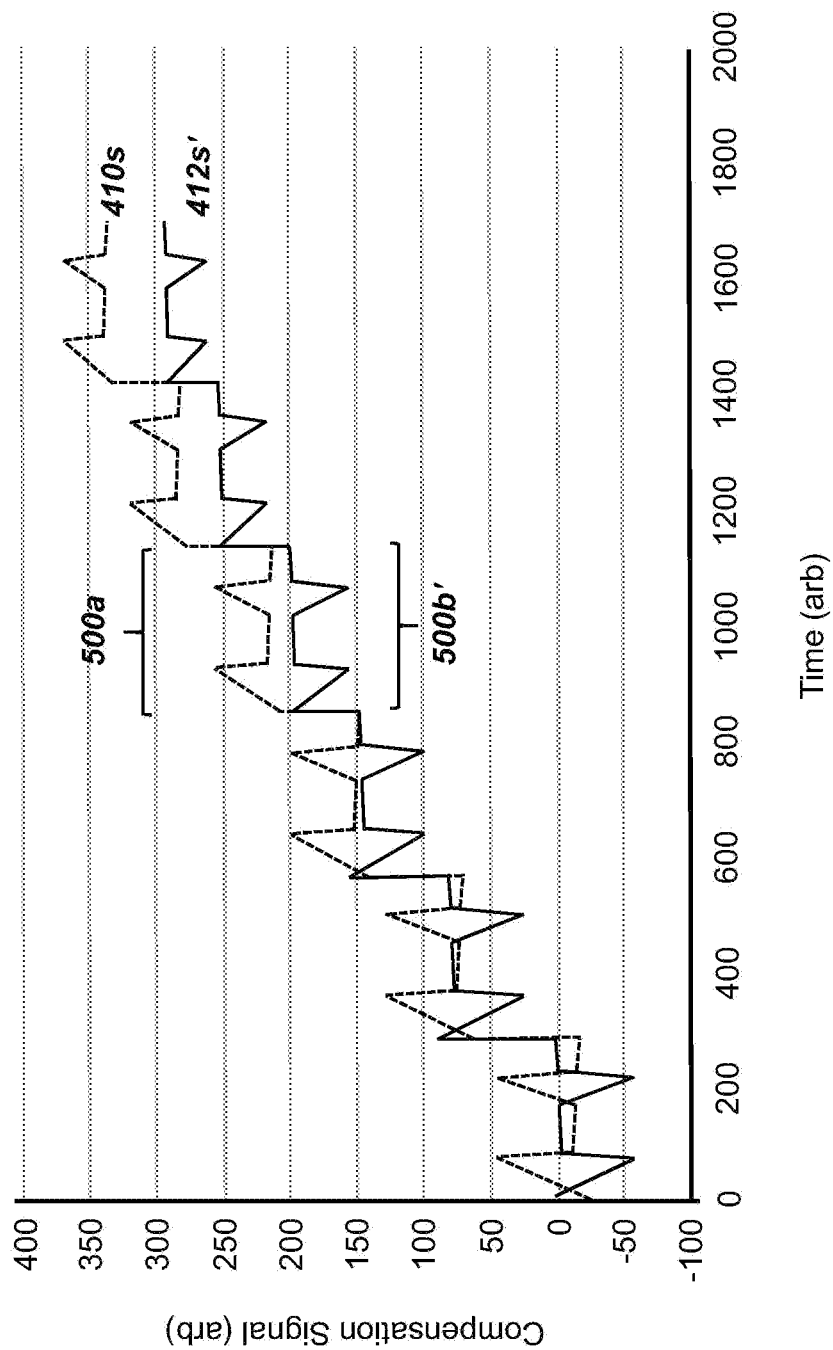
FIG. 6 is a plot of the first signal and a modified second signal representing the product of the second signal and a predetermined gain.

As shown in FIG. 6, the predetermined gain is applied to the second signal 412s alone (e.g., as a product), while the first signal 412s is unchanged. This yields a modified second signal 412s' having a runout pattern 500b' with a magnitude that is approximately the same as (e.g., within ±10% of) the magnitude of the runout pattern 500a. However, in alternative embodiments, a gain can be applied to the first signal alone, or to the first and the second signals in combination, so that the magnitudes of the runout patterns are approximately the same (e.g., within ±10% of one another). Subsequently, after application of the gain, the first and second signals 410 (e.g., the first signal 410s and the modified second signal 412s') can be summed to yield a gap-dependent reference signal 700s.

Figure 7:
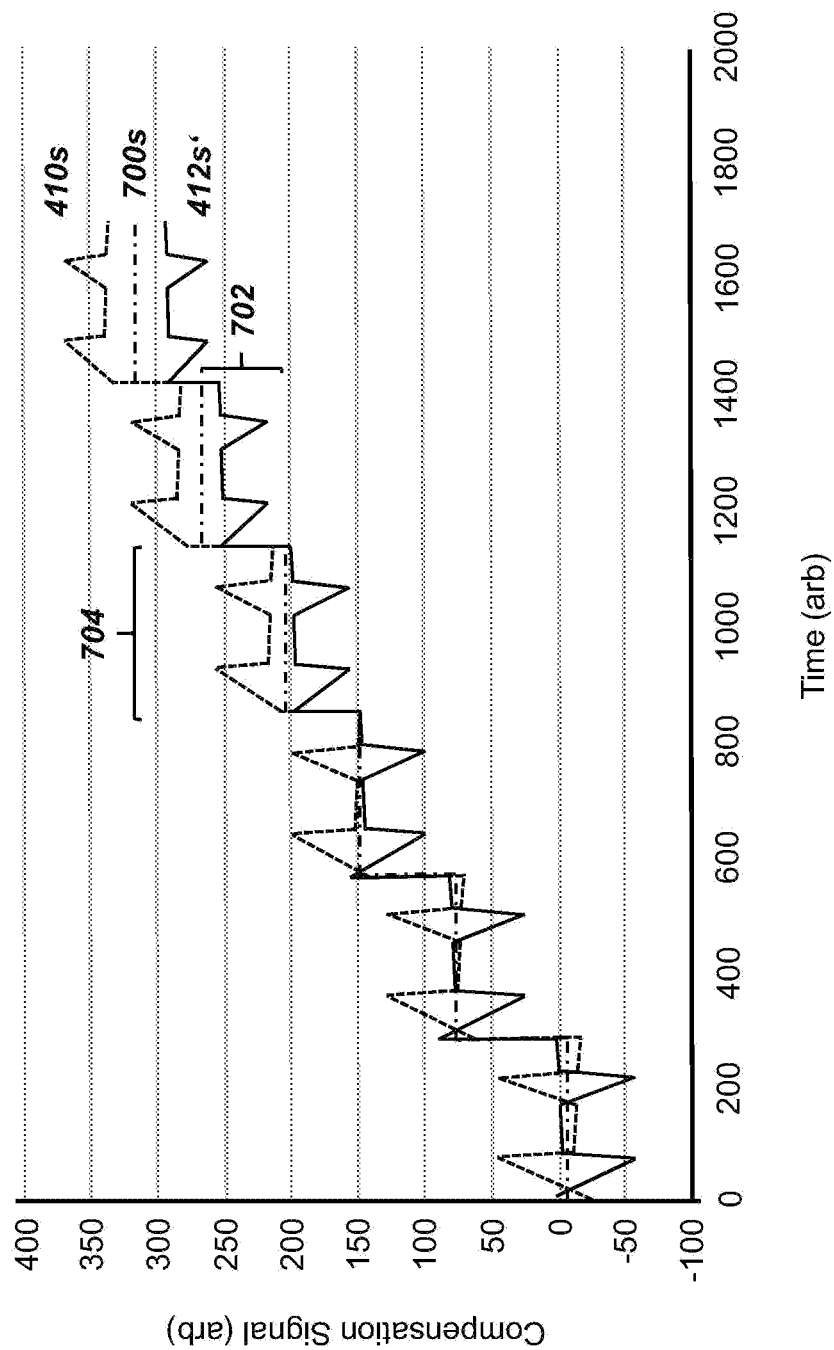
FIG. 7 is a plot illustrating a the gap-dependent reference signal representing the sum of the first signal and the modified second signal.

As an example, FIG. 7 reproduces the first signal 410s and the modified second signal 412s' along with their sum, representing the gap-dependent reference signal 700s. Because the magnitude of the drive voltage DV and the drive current DI respond in the same direction with the gap 224, the gap-dependent reference signal 700s exhibits increased gap sensitivity. This is demonstrated by the large changes 702 in magnitude when the gap 224 is varied. Concurrently, because the magnitude of the drive voltage DV and the drive current DI respond in opposite directions with electrical runout, the gap dependent reference signal 700s exhibits significantly reduced runout sensitivity. This is demonstrated by the relatively small changes in magnitude within respective runout patterns 704.

In further embodiments, application of the gain can be omitted. As an example, the sense resistor can be sized such that the magnitude of the runout patterns of the first signal and the second signal are approximately the same (e.g., within ±10% of one another). Subsequently the first and second signal can be summed to yield a gap-dependent reference signal.

With or without application of gain, a similar analysis can be performed for a second embodiment of the drive voltage DV and the drive current DI, where the magnitude of the drive voltage DV and the magnitude of the drive current DI respond in opposite directions with variation in the gap G, and respond in the same direction to electrical runout. Notably, however, because the response of the drive voltage DV and the drive current to the gap G and electrical runout in this second embodiments is opposite that of the first embodiment of the drive voltage DV and the drive current DI, the first and second signals can be subtracted to yield a gap-dependent reference signal.

Figure 8:
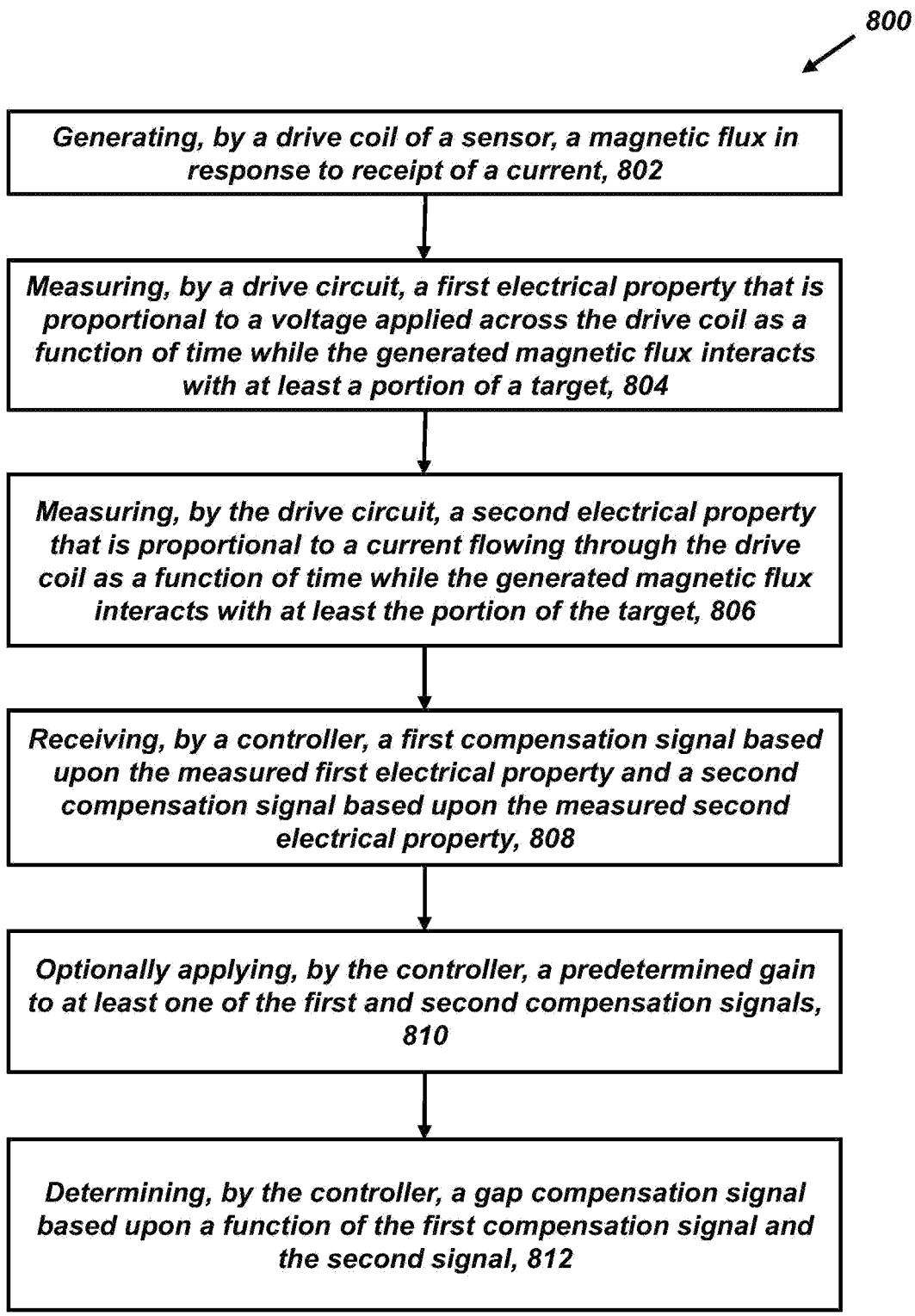
FIG. 8 is a flow diagram illustrating one exemplary embodiment of a method for determining the gap-dependent reference signal.

FIG. 8 is a flow diagram illustrating an exemplary embodiment of a method 800 for determining the gap-dependent reference signal 700s. The method 800 can be further employed for determining improved, gap-compensated measurements of stress (e.g., torque) applied to a rotating target. The method 800 is described below in connection with the compensated stress sensing system 200 of FIG. 2. As shown, the method 800 includes operations 802-812. However, in embodiments of the method can include greater or fewer operations than illustrated in FIG. 8 and these operations can be performed in a different order than illustrated in FIG. 8.

In operation 802, the drive coil 212 of the sensor can generate magnetic flux 254 in response to receipt of the current 244 (e.g., from the drive circuit 240). As an example, the sensor can be the magnetostrictive stress sensor including the core 210, the drive coil 212, and at least one sensing coil 214.

In operation 804, a first electrical property that is proportional to a voltage applied across the drive coil 212 (e.g., drive voltage DV) can be measured as a function time while the generated magnetic flux 254 interacts with at least a portion of the target 222 (e.g., the selected portion 224 of the target 222). As an example, the first electrical property can be measured by the first electrical property sensor 410 of the drive circuit 240, which is in parallel with the drive coil 212.

In operation 806, a second electrical property that is proportional to current flowing through the drive coil 212 can be measured as a function of time while the generated magnetic flux 254 interacts with the portion of the target 222. As an example, the second electrical property can be measured by the second electrical property sensor 412 of the drive circuit 240.

In operation 808, a first signal (e.g., 410s) based upon the measured first electrical property and a second signal (e.g., 412s) based upon the measured second electrical property can be received by a controller (e.g., processor 246 of controller 204).

Optionally, in operation 810, the controller (e.g., the processor 246) can apply a predetermined gain to at least one of the measured first and second signals. In one embodiment, the gain can be applied to the second signal 412s) to yield a modified second signal 412s'). The predetermined gain can be selected such that, after application, the magnitude of the respective portions of the first and second signals representing response of the measured first and second electrical properties to circumferential variation of magnetic properties of the rotating target (e.g., electrical runout), are approximately equal in magnitude (e.g., within ±10% of one another).

In alternative embodiments, application of the predetermined gain can be omitted. For example, the sense resistor of the drive circuit can be configured such that the magnitude of the respective portions of the first and second signals representing response of the measured first and second electrical properties to circumferential variation of magnetic properties of the rotating target (e.g., electrical runout), are approximately equal in magnitude (e.g., within ±10% of one another).

In operation 812, the controller 204 (e.g., the processor 246) can determine a gap compensation signal (e.g., the gap-dependent reference signal 700s) based upon a function of the first signal 410s and the second signal (either the second signal 412 without application of the predetermined gain or the modified second signal 412s' with application the predetermined gain.

As discussed above, in one embodiment of the drive voltage DV and the drive current DI, a magnitude of the drive voltage DV and the magnitude of the drive current DI change in the same direction in response to variation of a gap (e.g., gap 224) between the drive coil 212 and the target 222. Concurrently, the magnitude of the drive voltage DV and the magnitude of the drive current DI change in opposite directions in response to circumferential variation of magnetic properties (e.g., electrical runout) of the rotating target 222. As a result, the gap-dependent reference signal can be obtained from summation of the first signal 410s and the second signal 412s (or modified second signal 412s').

As further discussed above, in another embodiment of the drive voltage DV and the drive current DI, a magnitude of the drive voltage DV and the magnitude of the drive current DI change in the opposite direction in response to variation of a gap (e.g., gap 224) between the drive coil 212 and the target 222. Concurrently, the magnitude of the drive voltage DV and the magnitude of the drive current DI change in the same direction in response to circumferential variation of magnetic properties (e.g., electrical runout) of the rotating target. As a result, the gap-dependent reference signal can be obtained from subtraction of the first signal and the second signal (or modified second signal).

In general, the gap dependent reference signal can be obtained from a function of drive current DI and drive voltage DV that includes mathematical operations such as addition, subtraction, division, multiplication, logarithms, exponentiation, or trigonometric functions, alone or in any combination.

The resulting gap-dependent reference signal can exhibit enhanced sensitivity to changes in gap G and substantially reduced sensitivity to electrical runout. That is, the runout pattern of the first signal and the runout pattern of the second signal (or modified second signal) can approximately cancel one another.

In further embodiments, the controller 204 (e.g., the processor 246 can be configured to receive a stress signal from the sensor and combine the stress signal with the gap compensation signal to yield a gap-compensated stress signal, and output the gap-compensated stress signal. In alternative embodiments, the stress signal can represent other stress (e.g., tension, compression, shear) applied to the target.

Exemplary technical effects of the methods, systems, and devices described herein include, by way of non-limiting example determination of a gap-dependent reference signal that is sensitive to changes in a gap between a magnetostrictive sensor and a target, and is relatively insensitive to electrical runout. The gap-dependent reference signal 700s can be employed to acquire a measurement of stress applied to the target that is substantially insensitive to changes in gap.

Certain exemplary embodiments have been described to provide an overall understanding of the principles of the structure, function, manufacture, and use of the systems, devices, and methods disclosed herein. One or more examples of these embodiments have been illustrated in the accompanying drawings. Those skilled in the art will understand that the systems, devices, and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention. Further, in the present disclosure, like-named components of the embodiments generally have similar features, and thus within a particular embodiment each feature of each like-named component is not necessarily fully elaborated upon.

The subject matter described herein can be implemented in analog electronic circuitry, digital electronic circuitry, and/or in computer software, firmware, or hardware, including the structural means disclosed in this specification and structural equivalents thereof, or in combinations of them.

The subject matter described herein can be implemented as one or more computer program products, such as one or more computer programs tangibly embodied in an information carrier (e.g., in a machine-readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processor of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, (e.g., EPROM, EEPROM, and flash memory devices); magnetic disks, (e.g., internal hard disks or removable disks); magneto-optical disks; and optical disks (e.g., CD and DVD disks). The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, (e.g., a mouse or a trackball), by which the user can provide input to the computer. Other kinds of devices can be used to provide for interaction with a user as well. For example, feedback provided to the user can be any form of sensory feedback, (e.g., visual feedback, auditory feedback, or tactile feedback), and input from the user can be received in any form, including acoustic, speech, or tactile input.

The techniques described herein can be implemented using one or more modules. As used herein, the term "module" refers to computing software, firmware, hardware, and/or various combinations thereof. At a minimum, however, modules are not to be interpreted as software that is not implemented on hardware, firmware, or recorded on a non-transitory processor readable recordable storage medium (i.e., modules are not software per se). Indeed "module" is to be interpreted to always include at least some physical, non-transitory hardware such as a part of a processor or computer. Two different modules can share the same physical hardware (e.g., two different modules can use the same processor and network interface). The modules described herein can be combined, integrated, separated, and/or duplicated to support various applications. Also, a function described herein as being performed at a particular module can be performed at one or more other modules and/or by one or more other devices instead of or in addition to the function performed at the particular module. Further, the modules can be implemented across multiple devices and/or other components local or remote to one another. Additionally, the modules can be moved from one device and added to another device, and/or can be included in both devices.

The subject matter described herein can be implemented in a computing system that includes a back-end component (e.g., a data server), a middleware component (e.g., an application server), or a front-end component (e.g., a client computer having a graphical user interface or a web browser through which a user can interact with an implementation of the subject matter described herein), or any combination of such back-end, middleware, and front-end components. The components of the system can be interconnected by any form or medium of digital data communication, e.g., a communication network. Examples of communication networks include a local area network ("LAN") and a wide area network ("WAN"), e.g., the Internet.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

One skilled in the art will appreciate further features and advantages of the invention based on the above-described embodiments. Accordingly, the present application is not to be limited by what has been particularly shown and described, except as indicated by the appended claims. All publications and references cited herein are expressly incorporated by reference in their entirety.

The invention claimed is:
1. A system, comprising:
 a magnetostrictive sensor including a drive coil configured to generate a magnetic flux in response to receipt of a current;

a drive circuit in communication with the drive coil and configured to provide the current, the drive circuit including,
  a first sensing element configured to,
    measure a first electrical property proportional to a resistance at the drive coil as a function of time while the generated magnetic flux interacts with at least a portion of a target, and
    generate a first signal based upon the first electrical property measurement; and
  a second sensing element configured to,
    measure a second electrical property proportional to an inductance at the drive coil as a function of time while the generated magnetic flux interacts with at least a portion of the target, and
    generate a second signal based upon the second electrical property measurement; and
a controller in electrical communication with the magnetostrictive sensor and the drive circuit, wherein the controller is remotely located from the magnetostrictive sensor and the drive circuit, the controller being configured to receive the first and second signals, and to determine a gap compensation signal based upon a function of the first signal and the second signal, wherein the magnitude of the first signal and the magnitude of the second signal change in the same direction in response to variation of a gap between the drive coil and the target.

2. The system of claim 1, wherein the magnitude of the first signal and the magnitude of the second signal change in the same direction in response to variation of a gap between the drive coil and the target.

3. The system of claim 1, wherein the magnitude of the first signal and the magnitude of the second signal change in opposite directions in response to circumferential variation of magnetic properties of the target.

4. The system of claim 3, wherein the predetermined gain is selected such that, after application, the magnitude of respective portions of the first signal and modified second signals representing response of the measured first and second electrical properties to circumferential variation of magnetic properties of the target are approximately equal to the magnitude.

5. The system of claim 1, wherein the magnetostrictive sensor further comprises a sensing coil configured to output a stress signal characterizing a stress experienced by the target, wherein the stress signal is based at least upon a measurement of the generated magnetic flux resulting from interaction of the first magnetic flux with the target.

6. The system of claim 1, wherein the controller is further configured to:
  receive the stress signal,
  combine the stress signal with the gap compensation signal to yield a gap compensated stress signal; and
  output the gap compensated stress signal.

7. The system of claim 5, wherein the stress is a compression.

8. The system of claim 5, wherein the magnetostrictive sensor comprises a sensor head including a driving pole and a sensing pole, and wherein and the drive coil is coupled to the driving pole and the sensing coil is coupled to the sensing pole.

9. A method, comprising:
  generating, by a drive coil of a sensor, a magnetic flux in response to receipt of a current;
  measuring, by a drive circuit, a first electrical property proportional to a resistance at the drive coil as a function of time while the generated magnetic flux interacts with at least a portion of a target;
  measuring, by the drive circuit, a second electrical property proportional to an inductance at the drive coil as a function of time while the generated magnetic flux interacts with at least the portion of the target,
  receiving, by a controller remotely located from the sensor and the drive circuit, a first signal based upon the measured first electrical property and a second signal based upon the second measured electrical property; and
  determining, by the controller, a gap compensation signal based upon a function of the first signal and the second signal.

10. The method of claim 9, wherein the magnitude of the first signal and the magnitude of the second signal change in the same direction in response to variation of a gap between the drive coil and the target.

11. The method of claim 9, wherein the magnitude of the first signal and the magnitude of the second signal change in opposite directions in response to circumferential variation of magnetic properties of the target.

12. The system of claim 11, further comprising:
  applying a predetermined gain to at least one of the first and second signals prior to determining the gap compensation signal; and
  determining the gap compensation signal based upon the sum of the first signal and the second signal after application of the predetermined gain;
  wherein the predetermined gain is selected such that, after application, the magnitude of the respective portions of the first signal and the second signal, representing response of the measured first and second electrical properties to circumferential variation of magnetic properties of the target, are approximately equal in magnitude.

13. The method of claim 9, wherein the sensor is a magnetostrictive sensor comprising a sensing coil configured to output a stress signal characterizing a stress experienced by the target, wherein the stress signal is based at least upon a measurement of the generated magnetic flux resulting from interaction of the first magnetic flux with a target.

14. The method of claim 9, further comprising, by the controller:
  receiving the stress signal,
  combining the stress signal with the gap compensation signal to yield a gap-compensated stress signal; and
  outputting the gap-compensated stress signal.

15. The method of claim 14, wherein the stress is a compression.

16. The method of claim 14, wherein the magnetostrictive sensor further comprises a sensor head including a driving pole and a sensing pole, and wherein and the drive coil is coupled to the driving pole and the sensing coil is coupled to the sensing pole.

* * * * *